(12) United States Patent
Hagleitner et al.

(10) Patent No.: US 8,994,073 B2
(45) Date of Patent: Mar. 31, 2015

(54) HYDROGEN MITIGATION SCHEMES IN THE PASSIVATION OF ADVANCED DEVICES

(71) Applicant: Cree, Inc., Durham, NC (US)

(72) Inventors: Helmut Hagleitner, Zebulon, NC (US); Zoltan Ring, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/644,506

(22) Filed: Oct. 4, 2012

(65) Prior Publication Data

US 2014/0097469 A1     Apr. 10, 2014

(51) Int. Cl.
*H01L 31/0336*     (2006.01)

(52) U.S. Cl.
USPC ........... 257/194; 257/192; 257/193; 257/256; 257/259; 438/643; 438/644; 438/653

(58) Field of Classification Search
CPC ..................... H01L 21/3185; H01L 29/2003
USPC .......... 257/192–194, 256, 295; 438/643–644, 438/653
See application file for complete search history.

(56) References Cited

U.S. PATENT DOCUMENTS

| | | |
|---|---|---|
| 3,895,127 A | 7/1975 | Comizzoli |
| 3,982,267 A | 9/1976 | Henry |
| 4,551,353 A | 11/1985 | Hower et al. |
| 4,717,641 A | 1/1988 | Belmont et al. |
| 4,799,100 A | 1/1989 | Blanchard et al. |
| 5,332,697 A | 7/1994 | Smith et al. |
| 5,430,324 A | 7/1995 | Bencuya |
| 5,466,617 A | 11/1995 | Shannon |
| 5,605,852 A | 2/1997 | Bencuya |
| 5,650,638 A | 7/1997 | Harris et al. |
| 5,776,837 A | 7/1998 | Palmour |

(Continued)

FOREIGN PATENT DOCUMENTS

| | | |
|---|---|---|
| EP | 1149934 A2 | 10/2001 |
| EP | 1798762 A2 | 6/2007 |

(Continued)

OTHER PUBLICATIONS

Examination Report for European Patent Application No. 08163116, mailed Aug. 30, 2013, 4 pages.
Notice of Allowance for U.S. Appl. No. 11/169,378, mailed Jul. 29, 2008, 7 pages.
Notice of Allownce for U.S. Appl. No. 11/169,378, mailed Jul. 29, 2008, 7 pages.

(Continued)

*Primary Examiner* — Dung A. Le
(74) *Attorney, Agent, or Firm* — Withrow & Terranova, P.L.L.C.

(57) ABSTRACT

Embodiments of a Silicon Nitride (SiN) passivation structure for a semiconductor device are disclosed. In general, a semiconductor device includes a semiconductor body and a SiN passivation structure over a surface of the semiconductor body. In one embodiment, the SiN passivation structure includes one or more Hydrogen-free SiN layers on, and preferably directly on, the surface of the semiconductor body, a Hydrogen barrier layer on, and preferably directly on, a surface of the one or more Hydrogen-free SiN layers opposite the semiconductor body, and a Chemical Vapor Deposition (CVD) SiN layer on, and preferably directly on, a surface of the Hydrogen barrier layer opposite the one or more Hydrogen-free SiN layers. The Hydrogen barrier layer preferably includes one or more oxide layers of the same or different compositions. Further, in one embodiment, the Hydrogen barrier layer is formed by Atomic Layer Deposition (ALD).

23 Claims, 5 Drawing Sheets

(56) References Cited

U.S. PATENT DOCUMENTS

| | | | |
|---|---|---|---|
| 5,972,801 | A | 10/1999 | Lipkin et al. |
| 6,001,716 | A | 12/1999 | Liao |
| 6,246,076 | B1 | 6/2001 | Lipkin et al. |
| 6,396,090 | B1 | 5/2002 | Hsu et al. |
| 6,426,542 | B1 | 7/2002 | Tan |
| 6,429,518 | B1 | 8/2002 | Endo |
| 6,437,371 | B2 | 8/2002 | Lipkin et al. |
| 6,528,373 | B2 | 3/2003 | Lipkin et al. |
| 6,586,781 | B2 | 7/2003 | Wu et al. |
| 6,610,366 | B2 | 8/2003 | Lipkin |
| 6,673,662 | B2 | 1/2004 | Singh |
| 6,767,843 | B2 | 7/2004 | Lipkin et al. |
| 6,797,586 | B2 | 9/2004 | Dev |
| 6,825,501 | B2 | 11/2004 | Edmond et al. |
| 6,849,882 | B2 | 2/2005 | Chavarkar et al. |
| 6,939,756 | B1 | 9/2005 | Chung et al. |
| 7,332,795 | B2 | 2/2008 | Smith et al. |
| 7,525,122 | B2 | 4/2009 | Ring et al. |
| 7,598,576 | B2 | 10/2009 | Ward, III et al. |
| 7,696,584 | B2 | 4/2010 | Henning et al. |
| 7,855,401 | B2 | 12/2010 | Sheppard et al. |
| 7,858,460 | B2 | 12/2010 | Ring et al. |
| 2001/0009788 | A1 | 7/2001 | Lipkin et al. |
| 2001/0019168 | A1 | 9/2001 | Willer et al. |
| 2001/0023964 | A1 | 9/2001 | Wu et al. |
| 2001/0028100 | A1 | 10/2001 | Schmitz et al. |
| 2001/0050369 | A1 | 12/2001 | Zeng et al. |
| 2002/0011656 | A1 | 1/2002 | Swanson et al. |
| 2002/0052076 | A1 | 5/2002 | Khan et al. |
| 2002/0121641 | A1 | 9/2002 | Alok et al. |
| 2003/0020092 | A1 | 1/2003 | Parikh et al. |
| 2003/0025121 | A1 | 2/2003 | Edmond et al. |
| 2003/0160274 | A1 | 8/2003 | Das et al. |
| 2003/0201453 | A2 | 10/2003 | Edmond |
| 2004/0099888 | A1 | 5/2004 | Sriram |
| 2004/0099928 | A1 | 5/2004 | Nunan et al. |
| 2004/0118202 | A1 | 6/2004 | Iwaki et al. |
| 2004/0159865 | A1 | 8/2004 | Allen et al. |
| 2004/0160118 | A1 | 8/2004 | Knollenberg et al. |
| 2005/0019971 | A1 | 1/2005 | Slater, Jr. et al. |
| 2005/0097941 | A1 | 5/2005 | Sandvik et al. |
| 2005/0110042 | A1 | 5/2005 | Saito et al. |
| 2005/0156284 | A1 | 7/2005 | Schmidt |
| 2005/0170574 | A1 | 8/2005 | Sheppard et al. |
| 2005/0193800 | A1 | 9/2005 | DeBoer et al. |
| 2005/0212075 | A1 | 9/2005 | Neidig |
| 2005/0221628 | A1 | 10/2005 | Tanaka et al. |
| 2005/0258431 | A1 | 11/2005 | Smith et al. |
| 2005/0274980 | A1 | 12/2005 | Miyoshi |
| 2005/0285233 | A1 | 12/2005 | Huang et al. |
| 2006/0006414 | A1 | 1/2006 | Germain et al. |
| 2006/0006415 | A1 | 1/2006 | Wu et al. |
| 2006/0043379 | A1 | 3/2006 | Zhang et al. |
| 2006/0043437 | A1 | 3/2006 | Mouli |
| 2006/0118892 | A1 | 6/2006 | Wu et al. |
| 2006/0145190 | A1 | 7/2006 | Salzman et al. |
| 2006/0157733 | A1 | 7/2006 | Lucovsky et al. |
| 2006/0191474 | A1 | 8/2006 | Chen et al. |
| 2006/0202272 | A1 | 9/2006 | Wu et al. |
| 2007/0001174 | A1 | 1/2007 | Ring et al. |
| 2007/0001176 | A1 | 1/2007 | Ward, III et al. |
| 2007/0018198 | A1 | 1/2007 | Brandes et al. |
| 2007/0018199 | A1 | 1/2007 | Sheppard et al. |
| 2007/0018272 | A1 | 1/2007 | Henning et al. |
| 2007/0164321 | A1 | 7/2007 | Sheppard et al. |
| 2007/0164322 | A1 | 7/2007 | Smith et al. |
| 2008/0035934 | A1* | 2/2008 | Sheppard et al. ............ 257/76 |
| 2009/0215280 | A1 | 8/2009 | Ring et al. |
| 2010/0193772 | A1 | 8/2010 | Morosawa et al. |
| 2010/0193839 | A1 | 8/2010 | Takatani |
| 2010/0279092 | A1 | 11/2010 | Hwang et al. |
| 2010/0304047 | A1 | 12/2010 | Yang et al. |
| 2011/0151173 | A1 | 6/2011 | Ramadas et al. |
| 2012/0319572 | A1 | 12/2012 | Lee et al. |
| 2013/0037804 | A1 | 2/2013 | Lee et al. |

FOREIGN PATENT DOCUMENTS

| | | | |
|---|---|---|---|
| EP | 1972013 | A2 | 9/2008 |
| EP | 2031648 | A2 | 3/2009 |
| JP | H056886 | A | 1/1993 |
| JP | H05218015 | A | 8/1993 |
| JP | H05234991 | A | 9/1993 |
| TW | 471049 | B | 1/2002 |
| TW | 474024 | B | 1/2002 |
| TW | 579600 | B | 3/2004 |
| WO | 0113436 | A1 | 2/2001 |
| WO | 0249114 | A2 | 6/2002 |
| WO | 03032397 | A2 | 4/2003 |
| WO | 2005076365 | A1 | 8/2005 |
| WO | 2005114743 | A2 | 12/2005 |
| WO | 2005117129 | A1 | 12/2005 |
| WO | 2006098801 | A1 | 9/2006 |
| WO | 2007002860 | A1 | 1/2007 |
| WO | 2007018653 | A2 | 2/2007 |
| WO | 2007018918 | A2 | 2/2007 |
| WO | 2007064689 | A1 | 6/2007 |
| WO | 2007081528 | A2 | 7/2007 |
| WO | 2011125928 | A1 | 10/2011 |

OTHER PUBLICATIONS

Non-Final Office Action for U.S. Appl. No. 11/169,378, mailed Dec. 10, 2007, 7 pages.
Restriction Requirement for U.S. Appl. No. 11/169,378, mailed Aug. 29, 2007, 5 pages.
Non-Final Office Action for U.S. Appl. No. 11/845,805, mailed Apr. 2, 2010, 13 pages.
Notice of Allowance for U.S. Appl. No. 12/404,557, mailed Apr. 12, 2010, 6 pages.
Notice of Allowance for U.S. Appl. No. 11/328,550, mailed Mar. 30, 2009, 6 pages.
Notice of Allowance for U.S. Appl. No. 11/328,550, mailed Oct. 7, 2008, 7 pages.
Non-Final Office Action for U.S. Appl. No. 11/328,550, mailed Jun. 27, 2008, 7 pages.
Restriction Requirement for U.S. Appl. No. 11/328,550, mailed May 2, 2008, 7 pages.
Notice of Allowance for U.S. Appl. No. 11/462,016, mailed Dec. 4, 2009, 8 pages.
Non-Final Office Action for U.S. Appl. No. 11/462,016, mailed May 11, 2009, 14 pages.
Restriction Requirement for U.S. Appl. No. 11/462,016, mailed Dec. 29, 2008, 7 pages.
Extended European Search Report for European Patent Application No. 08163116.0, mailed Jan. 15, 2010, 2 pages.
International Search Report for PCT/US2006/048817, mailed Jun. 25, 2007, 3 pages.
Taiwanese Search Report for Taiwanese Patent Application No. 095123557 mailed Jan. 15, 2009 1 page.
Notice of Allowance for U.S. Appl. No. 11/845,805, mailed Aug. 12, 2010, 6, pages.
Notice of Allowance for U.S. Appl. No. 12/404,557, mailed Aug. 19, 2010, 6 pages.
Japanese Office Action for Japanese Patent Application No. 2008-218759 mailed May 17, 2012, 9 pages (including translation).
International Search Report and Written Opinion for PCT/US2013/061798, mailed Dec. 20, 2013, 10 pages.
Invitation to Pay Additional Fees and Partial Search for PCT/US2014/011286, mailed Apr. 23, 2014, 6 pages.
International Search Report and Written Opinion for PCT/US2014/011286, mailed Jun. 17, 2014, 16 pages.
Summons to Attend Oral Proceedings for European Patent Application 06785888.6, mailed Apr. 15, 2014, 7 pages.
Japanese Office Action for Japanese Patent Application No. 2013-077659, mailed Jun. 24, 2014, 6 pages.
Non-Final Office Action for U.S. Appl. No. 13/804,126, mailed Jan. 29, 2015, 10 pages.

* cited by examiner

HYDROGEN MITIGATION SCHEMES IN THE PASSIVATION OF ADVANCED DEVICES

FIELD OF THE DISCLOSURE

The present disclosure relates to passivation of a semiconductor device.

BACKGROUND

Chemical Vapor Deposition (CVD) Silicon Nitride (SiN) is commonly used to passivate advanced semiconductor devices such as, for example, Metal Semiconductor Field Effect Transistors (MESFETs), High Electron Mobility Transistors (HEMTs), Metal Oxide Semiconductor Field Effect Transistors (MOSFETs), and the like. CVD SiN has relatively low permittivity, good encapsulation properties, and is easy to deposit. As discussed below, the inventors have found that Hydrogen present in CVD SiN passivation structures adversely affects device characteristics. As such, there is a need for a SiN passivation structure that eliminates or substantially reduces the effects of Hydrogen in the SiN passivation structure.

SUMMARY

Embodiments of a Silicon Nitride (SiN) passivation structure for a semiconductor device and methods of fabrication thereof are disclosed. The semiconductor device may be, for example, a Metal Semiconductor Field Effect Transistor (MESFET), a High Electron Mobility Transistor (HEMT), a Metal Oxide Semiconductor Field Effect Transistors (MOSFET), or the like. In general, a semiconductor device includes a semiconductor body and a SiN passivation structure over a surface of the semiconductor body. In one embodiment, the SiN passivation structure includes one or more Hydrogen-free SiN layers on, and preferably directly on, the surface of the semiconductor body, a Hydrogen barrier layer on, and preferably directly on, a surface of the one or more Hydrogen-free SiN layers opposite the semiconductor body, and a Chemical Vapor Deposition (CVD) SiN layer on, and preferably directly on, a surface of the Hydrogen barrier layer opposite the one or more Hydrogen-free SiN layers. The CVD SiN layer is preferably a Plasma Enhanced CVD (PECVD) SiN layer. The Hydrogen barrier layer preferably includes one or more oxide layers of the same or different compositions. Preferably, the Hydrogen barrier layer includes one or more stoichiometric monolayers of the same or different compositions formed by Atomic Layer Deposition (ALD).

In one embodiment, the one or more Hydrogen-free SiN layers include a first Hydrogen-free SiN layer on, and preferably directly on, the surface of the semiconductor body and a second Hydrogen-free SiN layer on, and preferably directly on, a surface of the first Hydrogen-free SiN layer opposite the semiconductor body. In one embodiment, a refractive index of the first Hydrogen-free SiN layer is in a range of and including 1.84 to 1.95 and, in one preferred embodiment, is approximately equal to 1.86 (e.g., 1.86±10%, 1.86±5%, or 1.86±1%), and a refractive index of the second Hydrogen-free SiN layer is in a range of and including 1.95 to 2.03 and, in one preferred embodiment, is approximately equal to 2.02 (e.g., 2.02±10%, 2.02±5%, or 2.02±1%). In one embodiment, the first and second Hydrogen-free SiN layers are sputter-deposited SiN layers.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
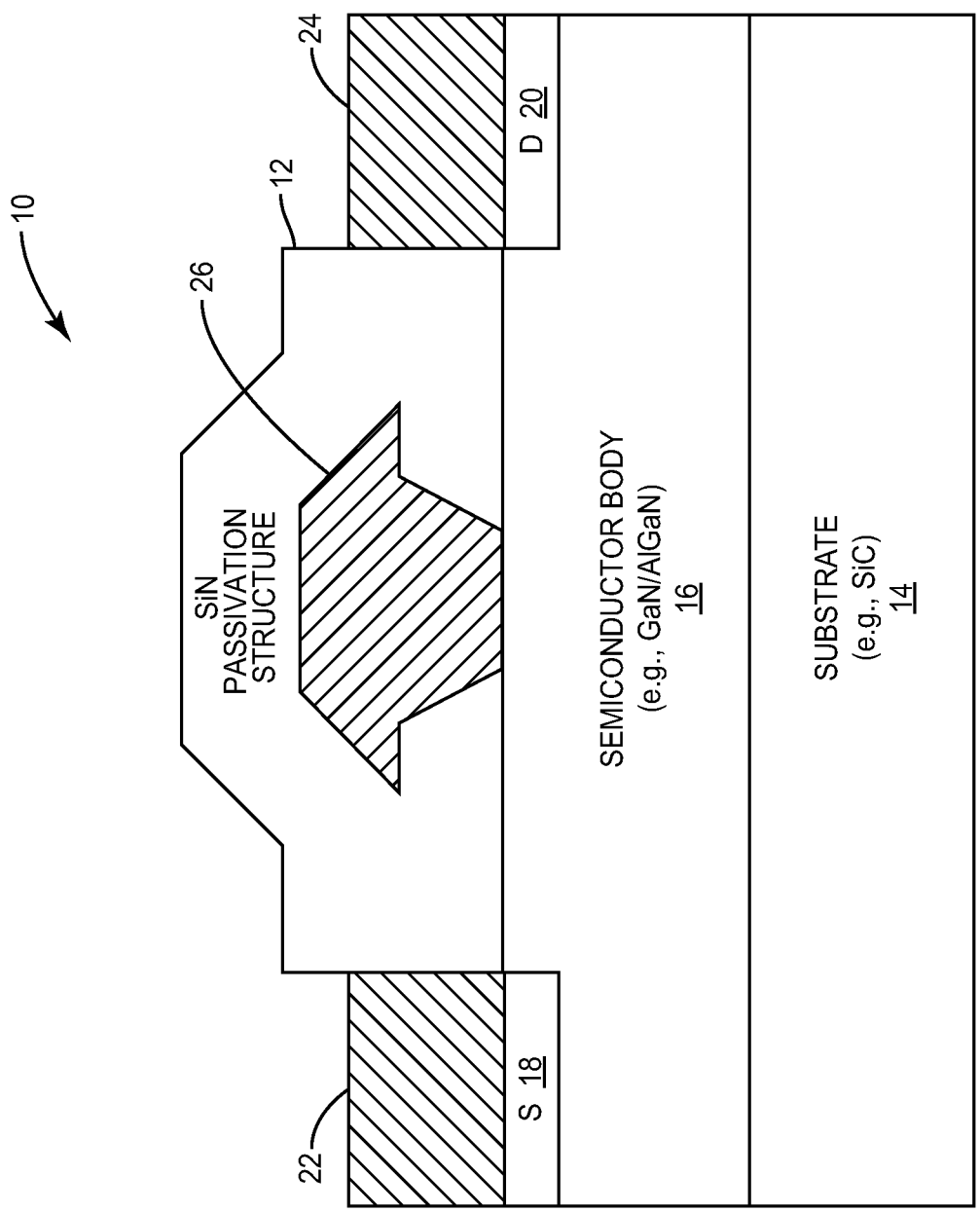
FIG. 1 illustrates a semiconductor device, and in particular a Metal Semiconductor Field Effect Transistor (MESFET), that incorporates a Silicon Nitride (SiN) passivation structure according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures.

It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Chemical Vapor Deposition (CVD) Silicon Nitride (SiN) is commonly used to passivate advanced semiconductor devices such as, for example, Metal Semiconductor Field Effect Transistors (MESFETs), High Electron Mobility Transistors (HEMTs), Metal Oxide Semiconductor Field Effect Transistors (MOSFETs), and the like. CVD SiN has relatively low permittivity, good encapsulation properties, and is easy to deposit. However, the inventors have found that one issue with CVD SiN passivation is that the CVD SiN contains a significant amount of Hydrogen stemming from the use of ammonia and silane as the precursors for the CVD process. This Hydrogen is weakly bonded in the SiN and, as such, can become mobile at elevated temperatures, which wreaks havoc on device performance. Specifically, as the Hydrogen becomes mobile, the Hydrogen represents mobile charges and can be re-trapped in different device areas, thereby changing device characteristics. As such, there is a need for a SiN passivation structure that eliminates or substantially reduces the effects of Hydrogen in the SiN passivation structure.

Embodiments of a SiN passivation structure for a semiconductor device that eliminate or substantially reduce the effects of Hydrogen in the SiN passivation structure and methods of fabrication thereof are disclosed. In this regard, FIG. 1 illustrates a semiconductor device, and in particular a Metal Semiconductor Field Effect Transistor (MESFET) 10, that incorporates a SiN passivation structure 12 according to one embodiment of the present disclosure. Notably, the SiN passivation structure 12 is not limited to use with the MESFET 10. Rather, the SiN passivation structure 12 can be utilized for passivation of any suitable semiconductor device. Some examples of additional semiconductor devices with which the SiN passivation structure 12 can be used are described below. However, these additional examples are only examples and are not to be construed as an exhaustive list of semiconductor devices with which the SiN passivation structure 12 can be used.

As illustrated in FIG. 1, the MESFET 10 includes a substrate 14 and a semiconductor body 16 on a surface of the substrate 14. The substrate 14 is preferably formed of Silicon Carbide (SiC), but is not limited thereto. The substrate 14 may be formed of other materials such as, for example, Sapphire, Aluminum Nitride (AlN), Aluminum Gallium Nitride (AlGaN), Gallium Nitride (GaN), Silicon (Si), Gallium Arsenide (GaAs), Zinc Oxide (ZnO), and Indium Phosphide (InP). The semiconductor body 16 preferably includes one or more epitaxial layers of one or more wideband materials such as, for example, one or more Group III nitrides. For example, the semiconductor body 16 may be formed of one or more layers of GaN or AlGaN. However, other Group III nitride materials may be used.

A source region 18 and a drain region 20 are formed in the semiconductor body 16 by, for example, implanting appropriate ions into a surface of the semiconductor body 16 to achieve a desired doping concentration. A source contact 22 is formed by one or more metallic layers on, and preferably directly on, the surface of the semiconductor body 16 adjacent to the source region 18. Likewise, a drain contact 24 is formed by one or more metallic layers on, and preferably directly on, the surface of the semiconductor body 16 adjacent to the drain region 20. The source and drain contacts 22 and 24 preferably provide low-resistance ohmic contacts to the source and drain regions 18 and 20, respectively. A gate contact 26 is formed by one or more metallic layers on, and preferably directly on, a surface of the semiconductor body 16 between the source region 18 and the drain region 20. The region within the semiconductor body 16 between the source and drain regions 18 and 20 is a channel region of the MESFET 10.

The SiN passivation structure 12 is formed on the surface of the semiconductor body 16 between the source contact 22 and the gate contact 26 and between the drain contact 24 and the gate contact 26. In this embodiment, the SiN passivation structure 12 extends over the gate contact 26. As discussed below, the SiN passivation structure 12 eliminates or at least mitigates the effects of Hydrogen in the SiN passivation structure 12 on the performance of the MESFET 10.

Figure 2:
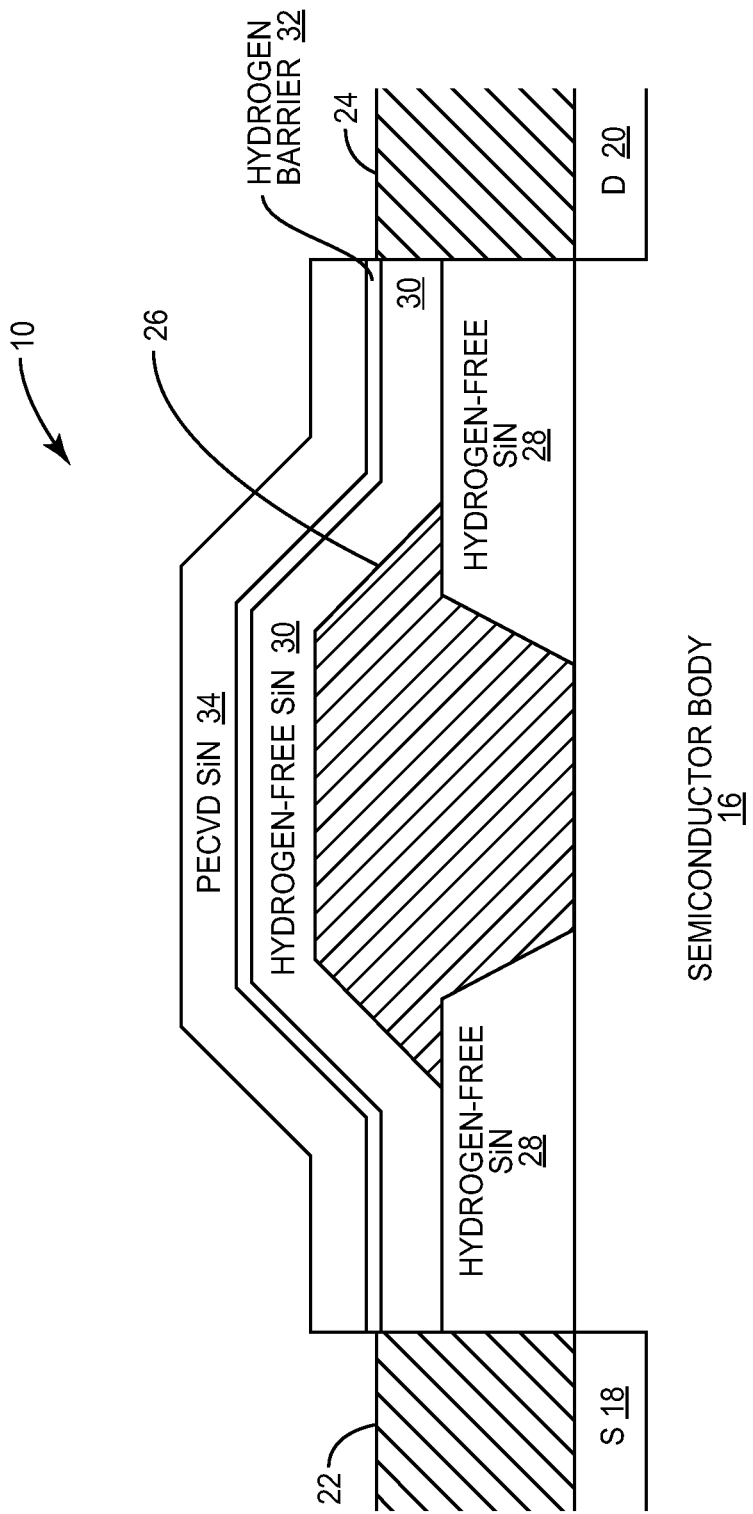
FIG. 2 illustrates the passivation structure of FIG. 1 in more detail according to one embodiment of the present disclosure.

More specifically, FIG. 2 illustrates the SiN passivation structure 12 of FIG. 1 in more detail according to one embodiment of the present disclosure. As illustrated, the SiN passivation structure 12 includes a Hydrogen-free SiN layer 28 on, and preferably directly on, the surface of the semiconductor body 16 opposite the substrate 14. In this embodiment, the Hydrogen-free SiN layer 28 is etched to form an opening in which the gate contact 26 is formed such that the gate contact 26 is in contact with the semiconductor body 16. In one alternative embodiment, in lieu of the Hydrogen-free SiN layer 28, the SiN passivation structure 12 may include low-Hydrogen, high-quality, SiN or Silicon Dioxide ($SiO_2$). The SiN passivation structure 12 also includes a Hydrogen-free SiN layer 30 on, and preferably directly on, a surface of the Hydrogen-free SiN layer 28 and a surface of the gate contact 26 opposite the semiconductor body 16. Together, the Hydrogen-free SiN layers 28 and 30 form a first passivation substructure that provides some benefits of SiN passivation (e.g., reduces parasitic capacitance, minimizes device trapping) and, in addition, positions subsequent passivation layers further from the channel region.

In addition, the SiN passivation structure 12 includes a Hydrogen barrier layer 32 on, and preferably directly on, a surface of the Hydrogen-free SiN layer 30 opposite the Hydrogen-free SiN layer 28. The Hydrogen barrier layer 32 preferably includes one or more oxide layers of the same or different composition. In one particular embodiment, the Hydrogen barrier layer 32 includes one or more layers of $SiO_2$, Aluminum Oxide ($Al_2O_3$), Titanium (III) Oxide (TiO), Hafnium Oxide (HfO), and/or the like. Notably, the Hydrogen barrier layer 32 may include one or more repeating sequences of oxide layers (e.g., $SiO_2$, $Al_2O_3$, $SiO_2$, $Al_2O_3$, etc.). The Hydrogen barrier layer 32 is preferably one or more stoichiometric monolayers of the same or different compositions formed by Atomic Layer Deposition (ALD).

Lastly, the SiN passivation structure 12 includes a Chemical Vapor Deposition (CVD) SiN layer 34 on, and preferably directly on, a surface of the Hydrogen barrier layer 32 opposite the Hydrogen-free SiN layer 30. Preferably, the CVD SiN layer 34 is formed by Plasma Enhanced Chemical Vapor Deposition (PECVD) using ammonia and silane as precursors. As a result, the CVD SiN layer 34 includes a substantial amount of Hydrogen. The Hydrogen barrier layer 32 along with the Hydrogen barrier properties of the Hydrogen-free SiN layers 28 and 30 prevent, or at least substantially reduce, migration of Hydrogen toward the surface of the semiconductor body 16. As a result, the effects of Hydrogen on the device characteristics and performance present when using CVD SiN passivation are eliminated, or at least substantially mitigated. Note that, in one alternative embodiment, the CVD SiN layer 34 is replaced with a SiN layer formed via ALD where the ALD process may, in some embodiments, use precursors that reduce or substantially eliminate Hydrogen in the SiN layer as compared to the CVD SiN layer 34.

Notably, as used herein, a "Hydrogen-free" layer is a layer that has no Hydrogen or no substantial amount of Hydrogen. As an example, sputtering is one technique that may be used to form a Hydrogen-free SiN layer. As such, in one particular embodiment, the Hydrogen-free SiN layers 28 and 30 are sputter-deposited SiN layers (i.e., SiN layers formed using a sputtering technique(s)). In contrast, a PECVD SiN layer formed using ammonia and silane as precursors includes a substantial amount of Hydrogen (e.g., about 15% to 22% Hydrogen) and is therefore not Hydrogen-free. Specifically, a sputtered layer of SiN has substantially no Hydrogen as compared to that contained in a PECVD SiN layer because, unlike PECVD which is a chemical process, sputtering SiN is a reactive physical process where Silicon atoms are knocked off of the target in the presence of Nitrogen gas flow under pressure and bias. So, for sputtered SiN, the only Hydrogen present in the SiN is incorporated from the walls of the growth chamber or the surface of the wafer after loading the wafer into the growth chamber.

As is well understood by one of ordinary skill in the art, the proportion of Silicon or Nitrogen in SiN can be determined by the refractive index of the SiN. In other words, the refractive index is an indicator of the composition of a SiN film. In one embodiment, a refractive index of the Hydrogen-free SiN layer 28 is in a range of and including 1.84 to 1.95 and more preferably approximately equal to 1.86 at an absorption 632 nanometers (nm) (e.g., 1.86±10%, 1.86±5%, or 1.86±1%), and a refractive index of the Hydrogen-free SiN layer 30 is in a range of and including 1.95 to 2.03 at an absorption 632 nm and more preferably is approximately equal to 2.02 at an absorption 632 nm (e.g., 2.02±10%, 2.02±5%, or 2.02±1%).

In one embodiment, a thickness of the Hydrogen-free SiN layer 28 is in a range of and including 250 to 600 Angstroms, a thickness of the Hydrogen-free SiN layer 30 is in a range of and including 1200 to 3000 Angstroms, a thickness of the Hydrogen barrier layer 32 is in a range of and including 250 Angstroms to 1200 Angstroms, and a thickness of the CDV SiN layer 34 is greater than 500 Angstroms. Note, however, that these thicknesses are only examples. Other thicknesses may be used depending on the particular implementation.

Figure 3:
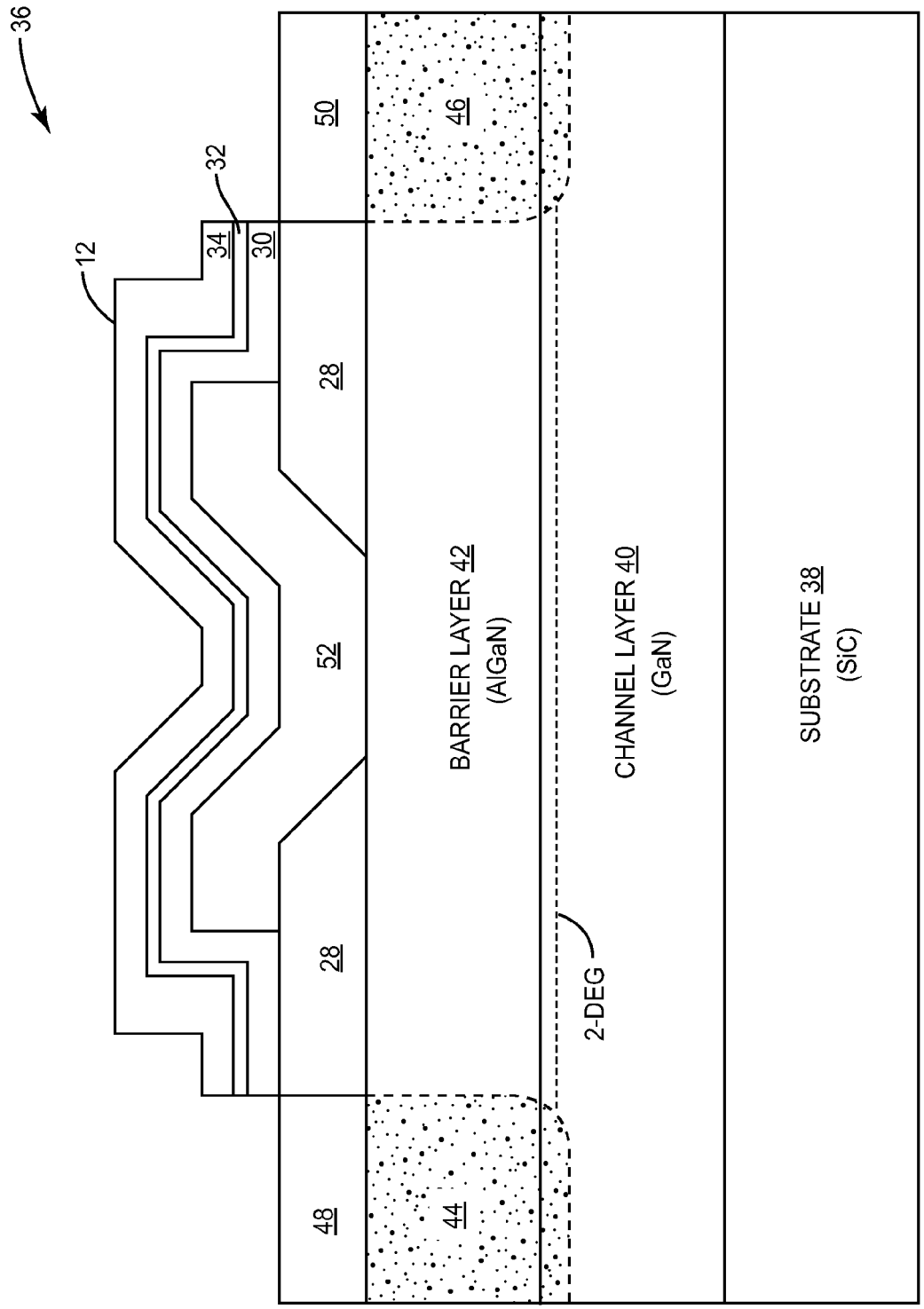
FIG. 3 illustrates a High Electron Mobility Transistor (HEMT) that includes a SiN passivation structure according to one embodiment of the present disclosure.

As discussed above, the applicability of the SiN passivation structure 12 is not limited to the MESFET 10. For example, the SiN passivation structure 12 may also be used with respect to a High Electron Mobility Transistor (HEMT) 36, as illustrated in FIG. 3. In this example, the HEMT 36 is formed in a Group III nitride material system on a substrate 38. In particular, the HEMT 36 is formed in a GaN/AlGaN material system, and the substrate 38 is formed of SiC. The substrate 38 is a semi-insulating substrate formed of a 4H polytype of SiC. Optional SiC polytypes include 3C, 6H, and 15R polytypes. The term "semi-insulating" is used in a relative rather than absolute sense. Alternative material for the substrate 38 may include Sapphire, AlN, AlGaN, GaN, Si, GaAs, ZnO, and InP. The substrate 38 is generally between 300 micrometers and 500 micrometers thick.

A channel layer 40 is formed on a surface of the substrate 38. Notably, as will be appreciated by one of ordinary skill in the art, a nucleation layer is typically formed between the substrate 38 and the channel layer 40 to provide an appropriate crystal structure transition between the substrate 38 and the channel layer 40. The channel layer 40 is formed by one or more epitaxial layers. For this example, the channel layer 40 is GaN. However, the channel layer 40 may more generally be a Group III nitride such as GaN, $Al_xGa_{1-x}N$ where $0 \leq X \leq 1$, Indium Gallium Nitride (InGaN), Aluminum Indium Gallium Nitride (AlInGaN), or the like. The channel layer 40 may be undoped, or at least unintentionally doped, and may be grown to a thickness of greater than about 20 Angstroms. In certain embodiments, the channel layer 40 may employ a multi-layer structure, such as a superlattice or alternating layers of different Group III nitrides, such as GaN, AlGaN, or the like.

A barrier layer 42 is formed on the channel layer 40. The barrier layer 42 may have a bandgap that is greater than the bandgap of the underlying channel layer 40. Further, the barrier layer 42 may have a smaller electron affinity than the channel layer 40. In this illustrated embodiment, the barrier layer 42 is AlGaN; however, the barrier layer 42 may include AlGaN, AlInGaN, AlN, or various combinations of these layers. The barrier layer 42 is generally between 20 Angstroms and 400 Angstroms thick; however, the barrier layer 42 should not be so thick as to cause cracking or substantial defect formation therein. The barrier layer 42 may be either undoped, or at least unintentionally doped, or doped with an n-type dopant to a concentration less than about $1 \times 10^{19}$ cm$^{-3}$. Notably, together, the channel layer 40 and the barrier layer 42 form a semiconductor body of the HEMT 36.

A source region 44 and a drain region 46 are formed in the semiconductor body by, for example, implanting appropriate ions into a surface of the barrier layer 42 to achieve a desired depth and doping concentration. The source and drain regions 44 and 46 extend just below the interface between the channel layer 40 and the barrier layer 42 where a two-dimensional electron gas (2-DEG) plane is formed during operation and in which electron conductivity is modulated. A source contact 48 is formed by one or more metallic layers on, and preferably directly on, the surface of the barrier layer 42 adjacent to the source region 44. Likewise, a drain contact 50 is formed by one or more metallic layers on, and preferably directly on, the surface of the barrier layer 42 adjacent to the drain region 46. The source and drain contacts 48 and 50 preferably provide low-resistance ohmic contacts to the source and drain regions 44 and 46, respectively. A gate contact 52 is formed by one or more metallic layers on, and preferably directly on, a surface of the barrier layer 42 between the source region 44 and the drain region 46.

The SiN passivation structure 12 is formed on the surface of the semiconductor body, and specifically on the surface of the barrier layer 42, between the source contact 48 and the gate contact 52 and between the drain contact 50 and the gate contact 52. In this embodiment, the SiN passivation structure 12 extends over the gate contact 52. As discussed above, the SiN passivation structure 12 includes the Hydrogen-free SiN layers 28 and 30, the Hydrogen barrier layer 32, and the CVD SiN layer 34. Again, the Hydrogen barrier layer 32 and the Hydrogen barrier properties of the Hydrogen-free SiN layers 28 and 30 eliminate or at least mitigate the effects of the Hydrogen in the CVD SiN layer 34. As a result, the performance of the HEMT 36 is substantially improved as compared to the performance of the same HEMT with conventional CVD SiN passivation.

Figure 4:
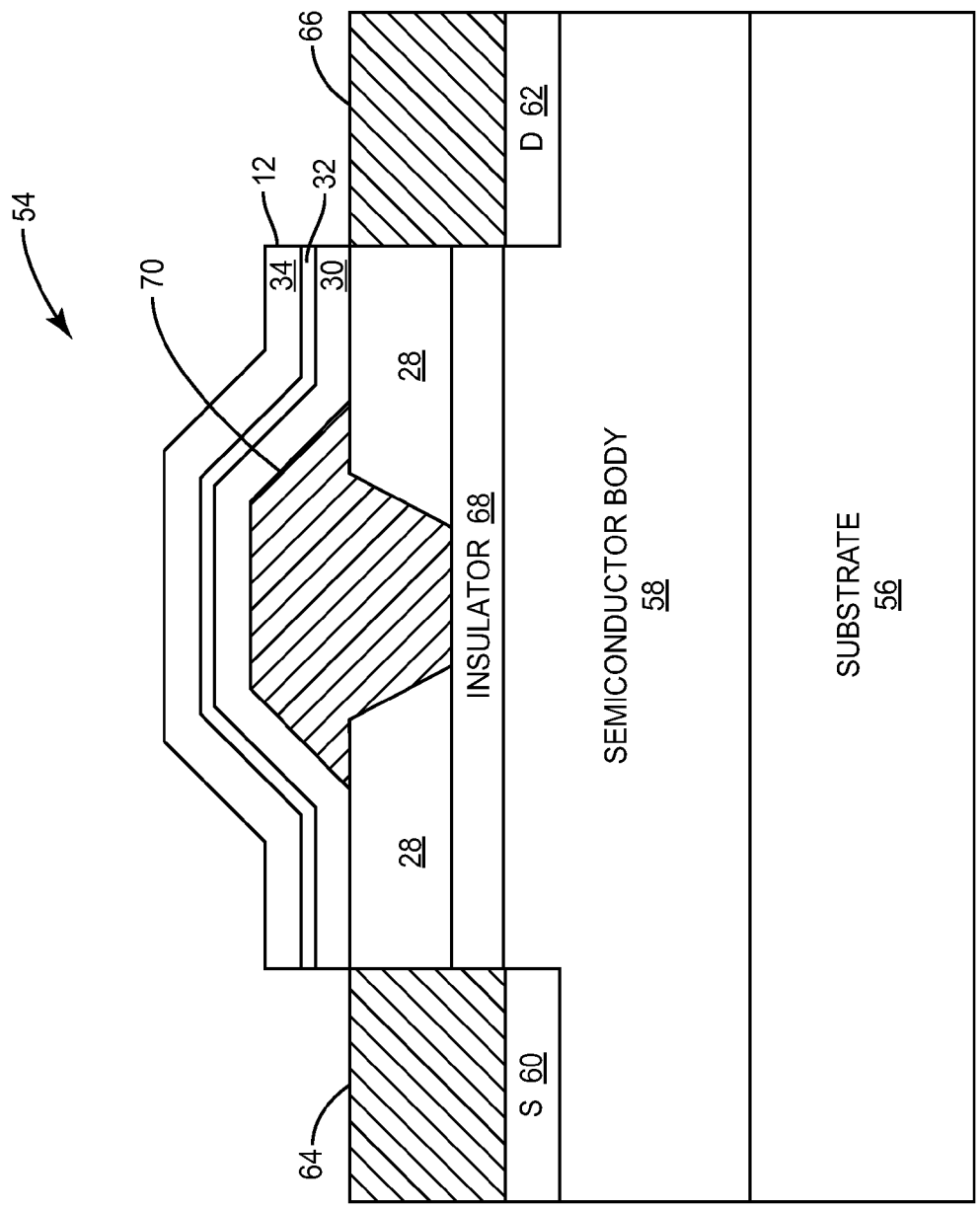
FIG. 4 illustrates a Metal-Oxide-Semiconductor Field Effect Transistor (MOSFET) that includes a SiN passivation structure according to one embodiment of the present disclosure.

As another example, the SiN passivation structure 12 may also be used with respect to a Metal Oxide Semiconductor Field Effect Transistor (MOSFET) 54, as illustrated in FIG. 4. In this example, the MOSFET 54 includes a substrate 56 and a semiconductor body 58 on a surface of the substrate 56. The substrate 56 is preferably formed of SiC, but is not limited thereto. The substrate 56 may be formed of other materials such as, for example, Sapphire, AlN, AlGaN, GaN, Si, GaAs, ZnO, and InP. The semiconductor body 58 preferably includes one or more epitaxial layers of one or more wideband materials such as, for example, one or more Group III nitrides. For example, the semiconductor body 58 may be formed of one or more layers of GaN or AlGaN. However, other Group III nitride materials may be used.

A source region 60 and a drain region 62 are formed in the semiconductor body 58 by, for example, implanting appropriate ions into a surface of the semiconductor body 58 to achieve a desired doping concentration. A source contact 64 is formed by one or more metallic layers on, and preferably directly on, the surface of the semiconductor body 58 adjacent to the source region 60. Likewise, a drain contact 66 is formed by one or more metallic layers on, and preferably directly on, the surface of the semiconductor body 58 adjacent to the drain region 62. The source and drain contacts 64 and 66 preferably provide low-resistance ohmic contacts to the source and drain regions 60 and 62, respectively.

In this embodiment, an insulator layer 68 is formed on, and preferably directly on, a surface of the semiconductor body 58 between the source and drain contacts 64 and 66. The insulator layer 68 may be, for example, one or more oxide layers (e.g., $SiO_2$). A gate contact 70 is formed by one or more metallic layers on, and preferably directly on, a surface of the insulator layer 68 through an opening in the Hydrogen-free SiN layer 28 between the source region 60 and the drain region 62. The region within the semiconductor body 58 between the source and drain regions 60 and 62 is a channel region of the MOSFET 54.

The SiN passivation structure 12 is formed on the surface of the semiconductor body 58, and more specifically on a surface of the insulator layer 68 opposite the semiconductor body 58, between the source contact 64 and the gate contact 70 and between the drain contact 66 and the gate contact 70. In this embodiment, the SiN passivation structure 12 extends over the gate contact 70. As discussed above, the SiN passivation structure 12 includes the Hydrogen-free SiN layers 28 and 30, the Hydrogen barrier layer 32, and the CVD SiN layer 34. Again, the Hydrogen barrier layer 32 and the Hydrogen barrier properties of the Hydrogen-free SiN layers 28 and 30 eliminate or at least mitigate the effects of the Hydrogen in the CVD SiN layer 34. As a result, the performance of the MOSFET 54 substantially improved as compared to the performance of the same MOSFET with conventional CVD SiN passivation.

Figure 5:
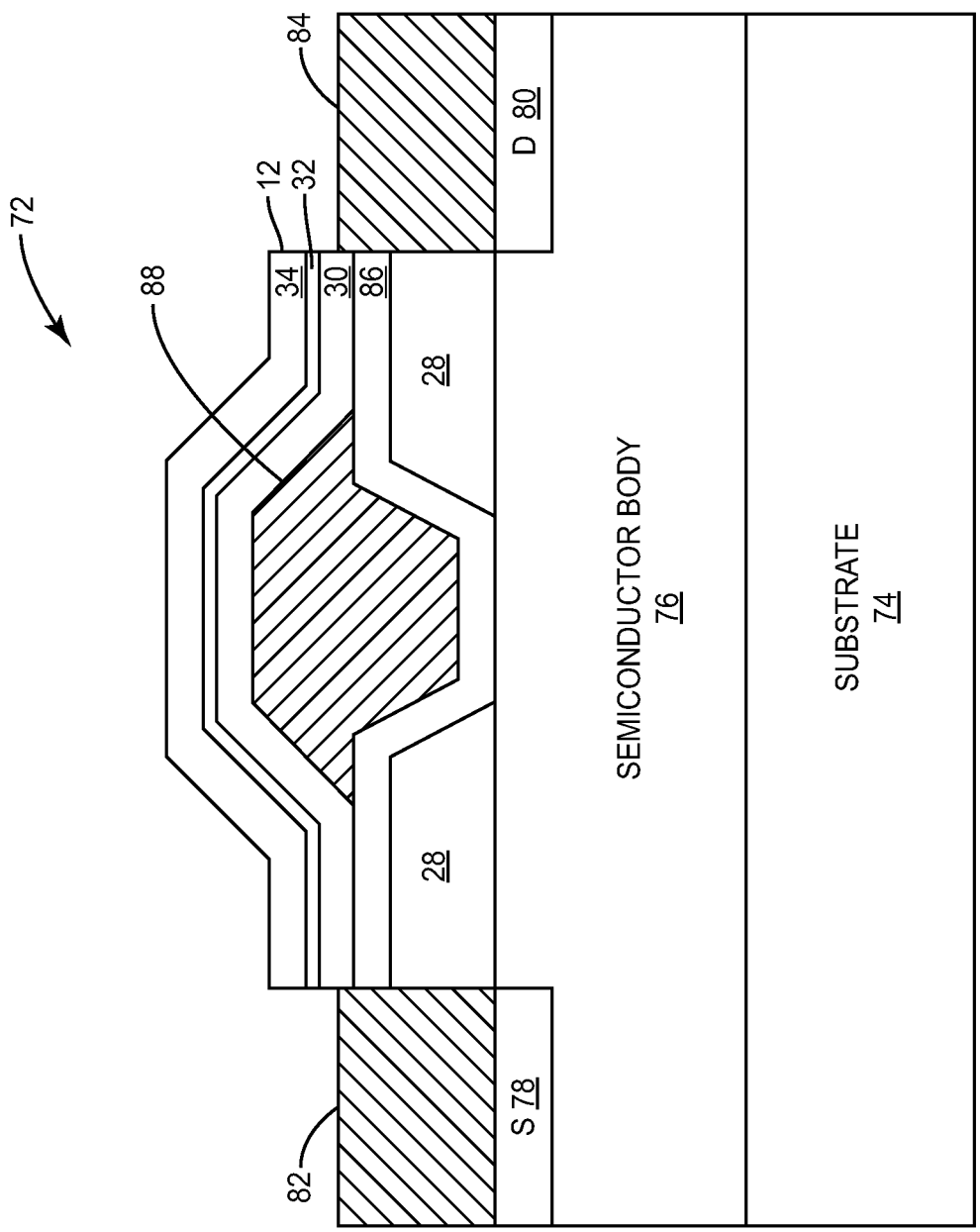
FIG. 5 illustrates a MOSFET that includes a SiN passivation structure according to another embodiment of the present disclosure.

FIG. 5 illustrates another example of a MOSFET 72 that includes the SiN passivation structure 12. In this example, the MOSFET 72 includes a substrate 74 and a semiconductor body 76 on a surface of the substrate 74. The substrate 74 is preferably formed of SiC, but is not limited thereto. The substrate 74 may be formed of other materials such as, for example, Sapphire, AlN, AlGaN, GaN, Si, GaAs, ZnO, and InP. The semiconductor body 76 preferably includes one or more epitaxial layers of one or more wideband materials such as, for example, one or more Group III nitrides. For example, the semiconductor body 76 may be formed of one or more layers of GaN or AlGaN. However, other Group III nitride materials may be used.

A source region 78 and a drain region 80 are formed in the semiconductor body 76 by, for example, implanting appropriate ions into a surface of the semiconductor body 76 to achieve a desired doping concentration. A source contact 82 is formed by one or more metallic layers on, and preferably directly on, the surface of the semiconductor body 76 adjacent to the source region 78. Likewise, a drain contact 84 is formed by one or more metallic layers on, and preferably directly on, the surface of the semiconductor body 80 adjacent to the drain region 80. The source and drain contacts 82 and 84 preferably provide low-resistance ohmic contacts to the source and drain regions 78 and 80, respectively.

In this embodiment, an insulator layer 86, or a gate insulator, for the MOSFET 72 is formed within the SiN passivation structure 12. More specifically, the Hydrogen-free SiN layer 28 is formed on a surface of the semiconductor body 76. An opening in the Hydrogen-free SiN layer 28 for a gate contact 88 of the MOSFET 72 is formed between the source and drain regions 78 and 80. The insulator layer 86 is then formed on a surface of the Hydrogen-free SiN layer 28 and on the surface of the semiconductor body 76 within the opening in the Hydrogen-free SiN layer 28. Next, the gate contact 88 is formed on, and preferably directly on, a surface of the insulator layer 86 over the opening in Hydrogen-free SiN layer 28, thereby providing an insulated gate contact for the MOSFET 72. The insulator layer 86 may be, for example, one or more oxide layers (e.g., $SiO_2$). The gate contact 88 is formed by one or more metallic layers. The region within the semiconductor body 76 between the source and drain regions 78 and 80 is a channel region of the MOSFET 72.

In addition to the Hydrogen-free SiN layer 28 and the insulator layer 86, the SiN passivation structure 12 includes the Hydrogen-free SiN layer 30 (which in this embodiment is formed on, and preferably directly on, a surface of the insulator layer 86 opposite the Hydrogen-free SiN layer 28), the Hydrogen barrier layer 32, and the CVD SiN layer 34. Again, the Hydrogen barrier layer 32 and the Hydrogen barrier properties of the Hydrogen-free SiN layers 28 and 30 eliminate or at least mitigate the effects of the Hydrogen in the CVD SiN layer 34. As a result, the performance of the MOSFET 72 is substantially improved as compared to the performance of the same MOSFET with conventional CVD SiN passivation.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device comprising:
   a semiconductor body; and
   a passivation structure on a surface of the semiconductor body, the passivation structure comprising:
   one or more Hydrogen-free Silicon Nitride layers on the surface of the semiconductor body;
   a Hydrogen barrier layer having more than one oxide layer on a surface of the one or more Hydrogen-free Silicon Nitride layers opposite the semiconductor body; and
   an additional Silicon Nitride layer on a surface of the Hydrogen barrier layer opposite the one or more Hydrogen-free Silicon Nitride layers.

2. The semiconductor device of claim 1 wherein the one or more oxide layers are formed via Atomic Layer Deposition.

3. The semiconductor device of claim 1 wherein at least two of the one or more oxide layers have different compositions.

4. The semiconductor device of claim 1 wherein the additional Silicon Nitride layer contains a substantial amount of Hydrogen.

5. The semiconductor device of claim 4 wherein the additional Silicon Nitride layer is a Plasma Enhanced Chemical Vapor Deposition Silicon Nitride layer.

6. The semiconductor device of claim 4 wherein the one or more Hydrogen-free Silicon Nitride layers are one or more sputtered Silicon Nitride layers.

7. The semiconductor device of claim 1 wherein the semiconductor device is a Metal Semiconductor Field Effect Transistor.

8. The semiconductor device of claim 1 wherein the semiconductor device is a High Electron Mobility Transistor.

9. The semiconductor device of claim 1 further comprising:
a source region in the semiconductor body;
a drain region in the semiconductor body;
a source contact on the surface of the semiconductor body adjacent to the source region;
a drain contact on the surface of the semiconductor body adjacent to the drain region; and
a gate contact on the surface of the semiconductor body between the source region and the drain region;
wherein the passivation structure is on the surface of the semiconductor body at least between the source contact and the gate contact and between the drain contact and the gate contact.

10. The semiconductor device of claim 1 wherein the semiconductor device is a Metal Oxide Semiconductor Field Effect Transistor.

11. The semiconductor device of claim 10 further comprising:
a source region in the semiconductor body;
a drain region in the semiconductor body;
a source contact on the surface of the semiconductor body adjacent to the source region;
a drain contact on the surface of the semiconductor body adjacent to the drain region;
an insulator layer on the surface of the semiconductor body between the source contact and the drain contact; and
a gate contact on a surface of the insulator layer between the source contact and the drain contact opposite the semiconductor body;
wherein the passivation structure is on the surface of the insulator layer opposite the semiconductor body at least between the source contact and the gate contact and between the drain contact and the gate contact.

12. The semiconductor device of claim 10 further comprising:
a source region in the semiconductor body;
a drain region in the semiconductor body;
a source contact on the surface of the semiconductor body adjacent to the source region; and
a drain contact on the surface of the semiconductor body adjacent to the drain region;
wherein the passivation structure comprises:
a first Hydrogen-free Silicon Nitride layer on the surface of the semiconductor body between the source region and the drain region and having an opening for a gate contact;
an insulator layer on a surface of the first Hydrogen-free Silicon Nitride layer opposite the semiconductor body and on the surface of the semiconductor body within the opening for the gate contact;
one or more second Hydrogen-free Silicon Nitride layers on a surface of the insulator layer opposite the first Hydrogen-free Silicon Nitride layer and the semiconductor body;
the Hydrogen barrier layer on a surface of the one or more second Hydrogen-free Silicon Nitride layers opposite the insulator layer; and
the additional Silicon Nitride layer on the surface of the Hydrogen barrier layer opposite the one or more second Hydrogen-free Silicon Nitride layers;
further wherein the semiconductor device further comprises the gate contact on the surface of the insulator layer between the insulator layer and the one or more second Hydrogen-free Silicon Nitride layers and over the opening for the gate contact.

13. A semiconductor device comprising:
a semiconductor body; and
a passivation structure on a surface of the semiconductor body, the passivation structure comprising:
one or more sputtered Silicon Nitride layers on the surface of the semiconductor body;
a Hydrogen barrier layer having more than one oxide layer on a surface of the one or more sputtered Silicon Nitride layers opposite the semiconductor body; and
an additional layer of Silicon Nitride on a surface of the Hydrogen barrier layer opposite the one or more sputtered Silicon Nitride layers.

14. A method of fabricating a passivation structure for a semiconductor device comprising:
providing one or more Hydrogen-free Silicon Nitride layers on a surface of a semiconductor body of the semiconductor device;
providing a Hydrogen barrier layer having more than one oxide layer on a surface of the one or more Hydrogen-free Silicon Nitride layers opposite the semiconductor body; and
providing an additional Silicon Nitride layer on a surface of the Hydrogen barrier layer opposite the one or more Hydrogen-free Silicon Nitride layers.

15. The method of claim 14 wherein providing the one or more oxide layers comprises depositing the one or more oxide layers by Atomic Layer Deposition.

16. The method of claim 14 wherein providing the one or more oxide layers comprises providing at least two oxide layers having different compositions.

17. The method of claim 14 wherein providing the additional Silicon Nitride layer comprises providing the additional Silicon Nitride layer such that the additional Silicon Nitride layer contains a substantial amount of Hydrogen.

18. The method of claim 17 wherein providing the additional Silicon Nitride layer comprises depositing the additional Silicon Nitride layer by Plasma Enhanced Chemical Vapor Deposition.

19. The method of claim 17 wherein the providing the one or more Hydrogen-free Silicon Nitride layers comprises sputtering the one or more Hydrogen-free Silicon Nitride layers.

20. The method of claim 17 wherein the semiconductor device is a Metal Semiconductor Field Effect Transistor.

21. The method of claim 14 wherein the semiconductor device is a High Electron Mobility Transistor.

22. The method of claim 14 wherein the semiconductor device is a Metal-Oxide-Semiconductor Field Effect Transistor.

23. A method of fabricating a passivation structure for a semiconductor device comprising:
   providing one or more sputtered Silicon Nitride layers on a surface of a semiconductor body of the semiconductor device;
   providing a Hydrogen barrier layer having more than one oxide layer on a surface of the one or more sputtered Silicon Nitride layers opposite the semiconductor body; and
   providing an additional Silicon Nitride layer on a surface of the Hydrogen barrier layer opposite the one or more sputtered Silicon Nitride layers.

* * * * *

UNITED STATES PATENT AND TRADEMARK OFFICE
CERTIFICATE OF CORRECTION

PATENT NO. : 8,994,073 B2
APPLICATION NO. : 13/644506
DATED : March 31, 2015
INVENTOR(S) : Helmut Hagleitner and Zoltan Ring It is certified that error appears in the above-identified patent and that said Letters Patent is hereby corrected as shown below:

In the Claims:

In column 10, line 61, in claim 20, replace "17" with --14--.

Signed and Sealed this
Twelfth Day of January, 2016

Michelle K. Lee
*Director of the United States Patent and Trademark Office*